United States Patent
Mizoguchi et al.

(10) Patent No.: US 7,067,832 B2
(45) Date of Patent: Jun. 27, 2006

(54) EXTREME ULTRAVIOLET LIGHT SOURCE

(75) Inventors: Hakaru Mizoguchi, Kanagawa (JP); Akira Endo, Tokyo (JP); Hirokazu Tanaka, Osaka (JP)

(73) Assignee: Gigaphoton, Inc., Tokyo (JP)

( * ) Notice: Subject to any disclaimer, the term of this patent is extended or adjusted under 35 U.S.C. 154(b) by 75 days.

(21) Appl. No.: 10/489,431

(22) PCT Filed: Apr. 4, 2003

(86) PCT No.: PCT/JP03/04315

§ 371 (c)(1),
(2), (4) Date: Mar. 12, 2004

(87) PCT Pub. No.: WO03/085707

PCT Pub. Date: Oct. 16, 2003

(65) Prior Publication Data
US 2004/0238762 A1 Dec. 2, 2004

(30) Foreign Application Priority Data
Apr. 5, 2002 (JP) .................... 2002-103975

(51) Int. Cl.
*G01J 1/00* (2006.01)
(52) U.S. Cl. .................. 250/504 R; 250/251; 378/119; 378/34; 378/143
(58) Field of Classification Search ........... 250/504 R, 250/493.1; 378/119, 34
See application file for complete search history.

(56) References Cited

U.S. PATENT DOCUMENTS 5,991,360 A * 11/1999 Matsui et al. ............... 378/119
6,377,651 B1 * 4/2002 Richardson et al. .......... 378/34
6,867,843 B1 * 3/2005 Ogushi et al. ................ 355/30

FOREIGN PATENT DOCUMENTS

| EP | 0858249 A1 | 8/1998 |
| JP | 2000-002800 A | 1/2000 |
| JP | 2000-008891 A | 1/2002 |

* cited by examiner

Primary Examiner—Nikita Wells
Assistant Examiner—Zia R. Hashmi
(74) Attorney, Agent, or Firm—Posz Law Group, PLC; R. Eugene Varndell, Jr.

(57) ABSTRACT

An extreme ultraviolet light source device which makes it possible to increase a working distance and obtain extreme ultraviolet light with a high output. The extreme ultraviolet light source device generates a plasma by irradiating a target (22) with laser light from a driving laser device (25), and generates extreme ultraviolet (EUV) light with a wavelength of several nanometers to several tens of nanometers. The extreme ultraviolet light source device comprises a target supply device which has a charge applying unit (23) that applies a charge to the target (22), and an acceleration unit (24) which accelerates the charged target (22) using an electromagnetic field. The target supply device supplies the target (22) comprised of a rare gas element such as xenon (Xe) or the like, or a metal such as lithium (Li), tin (Sn), tin oxide ($SnO_2$) or the like, as ionized molecules, atoms or masses comprising a plurality of atoms, or as ionized clusters.

17 Claims, 6 Drawing Sheets

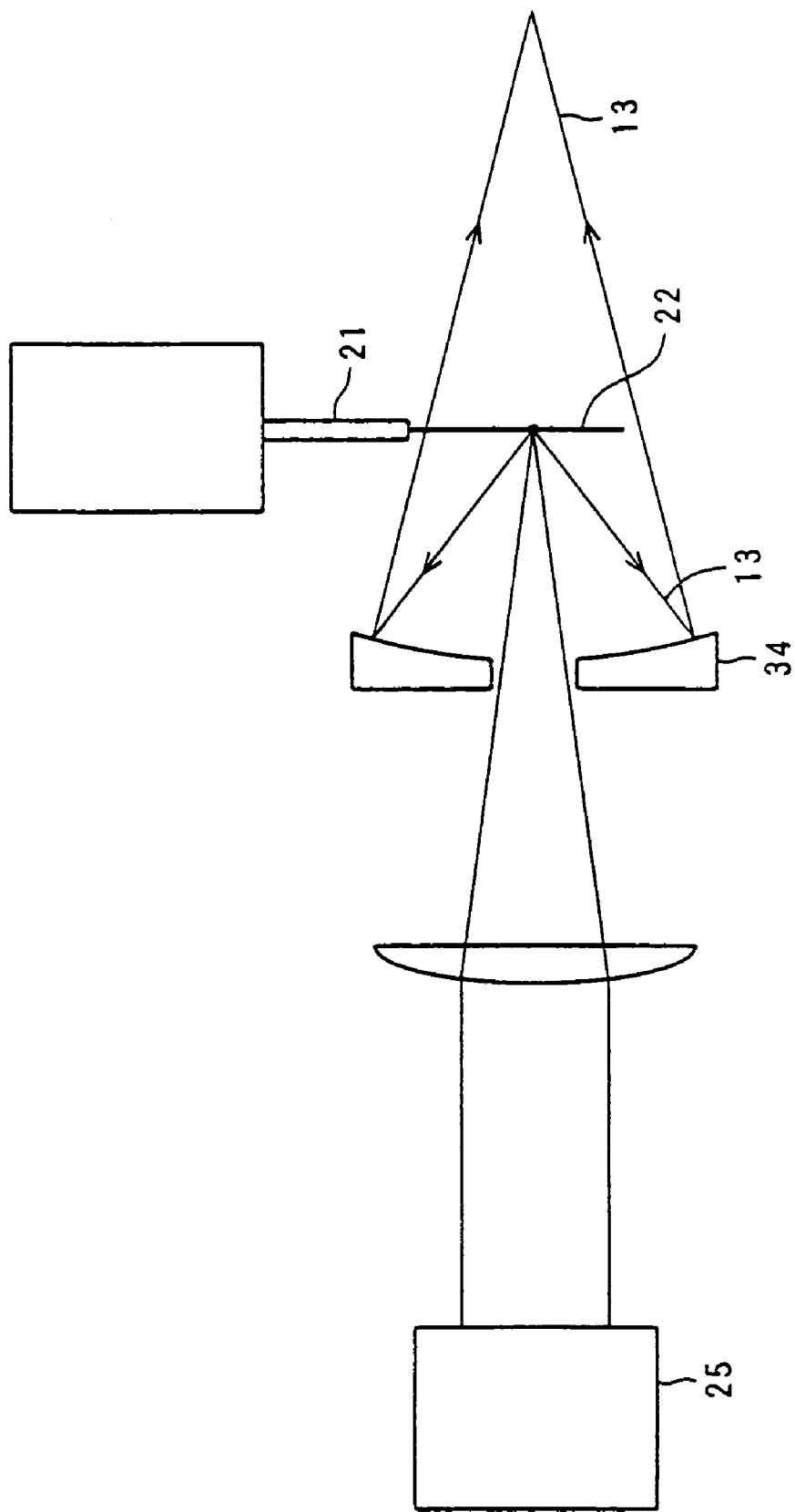

EXTREME ULTRAVIOLET LIGHT SOURCE

TECHNICAL FIELD

The present invention relates to an extreme ultraviolet light source device that is used as a light source in photolithography.

BACKGROUND ART

With the increasing fineness seen in semiconductor processes, there has also been a rapid increase in the fineness of photolithography. The early achievement of the schedule for increased fineness in the SIA roadmap has advanced year by year; this trend is accelerating, with an achievement one year ahead of schedule from the edition at the end of 1997 to the 1999 edition, and an achievement two years ahead of schedule in Scenario 2 of the 2000 edition. Accompanying this trend, there has been a yearly advance in the decrease of wavelengths of lithographic light sources. Specifically, beside the g line and i line of mercury lamps, exposure apparatuses that combine KrF excimer laser devices ($\lambda$=248 nm) or ArF excimer laser devices ($\lambda$=193 nm) with a refractive optical system (dioptric system) were used.

There is currently active research and development involving F2 laser exposure apparatuses that combine an F2 laser device ($\lambda$=157 nm) with even shorter-wavelength and a reflective-refractive optical system (catadioptric system) for use in the next generation of fine working at 100 to 70 nm node. Furthermore, an EUV exposure apparatus 10 that combines an extreme ultraviolet (EUV) light source with a wavelength of 13 nm and a reducing projection reflective optical system (cataoptric system) is expected for use in fine working at 50 nm node or below.

EUV exposure apparatuses will be described below. EUV exposure is a type of photolithography.

FIG. 5 shows one example of an EUV exposure apparatus 10 of the prior art. As is shown in FIG. 5, extreme ultraviolet light 13 with a wavelength of approximately 13 nm that is emitted from an extreme ultraviolet light source 11 inside a vacuum chamber (not shown in the figures) passes through a debris shield 12 and enters an illumination optical system 14. Furthermore, the term "debris" refers to debris that is generated by the extreme ultraviolet light source 11; the debris shield 12 prevents such debris from adhering to the optical elements.

The extreme ultraviolet light 13 that is shaped by a light-gathering mirror 15 is reflected by reflective mirrors 16, 16, and enters a reflective type mask (not shown in the figures) that mounted on the undersurface (in FIG. 5) of a reticle stage 17. A semiconductor circuit pattern is drawn on the reflective type mask, and the extreme ultraviolet light 13 enters a reducing reflective optical system 19 as an image of the semiconductor circuit pattern. As a result of being repeatedly reflected inside the reducing reflective optical system 19, the image of the semiconductor circuit pattern is reduced, and is focused as an image on the surface of a resist (not shown in the figures) that is coated onto a silicon wafer 20 carried on a wafer stage. As a result, an ultra-LSI circuit is formed.

Since the extreme ultraviolet light 13 has an extremely strong correlation with the substance used, a special structure is required in the reflective film of the reducing reflective optical system 19. Currently, in the case of an Mo/Si multi-layer film, a reflectivity of approximately 70% is obtained in a multi-layer film at the wavelength of 13 to 14 nm. Furthermore, in the case of a Be/Si multi-layer film, a reflectivity of close to 70% is obtained at the wavelength of 10 to 11 nm. However, since Be is very toxic, the realization of an extreme ultraviolet light source with a high brightness in the vicinity of 13 to 14 nm where a high reflectivity is obtained in an Mo/Si multi-layer film is desired.

Assuming that the throughput of an EUV exposure apparatus 10 is 80 frames/hour, and that the resist sensitivity is 5 mJ/cm$^2$, a light source of 50 to 150 W is considered necessary for optical systems that are currently under consideration.

Furthermore, since the extreme ultraviolet light source 11 is a point light source or a collection of point light sources, the extreme ultraviolet light 13 must be in a range that allows the light to be gathered by the light-gathering mirror 15 of the illumination optical system and utilized. Specifically, in the propagation of the light beam of such point light source light, on the principle that the etendue is always constant, the etendue of the illuminated region (product of the area of the illuminated region and the steric angle of the illuminating light) must be smaller than the etendue on the side of the Light source (product of the area of the light source and the steric angle of diffusion).

If the etendue on the side of the light source is large, the light beam that cannot be taken into the illumination system increases. Accordingly, it is necessary to keep the etendue on the side of the light source at a small value; in order to accomplish this, however, the size of the light source must be sufficiently reduced. For example, in order to gather light from the light source at a steric angle of $\pi$, the diameter of the light source must be approximately 0.5 mm or less.

Furthermore, in order to ensure a uniform line width in the exposure pattern, it is desirable to use numerous pulses of illumination, and to control the amount of exposure by adding such pulses. A high repetition frequency is required for this purpose. Furthermore, in order to achieve accurate control of the amount of exposure, it is also necessary to suppress fluctuations in the individual pulses to a sufficiently small value.

An LPP (laser produced plasma) light source among various types of extreme ultraviolet light sources 11 will be described with reference to FIG. 6. This is a light source in which a plasma is produced by gathering light and illuminating a target 22 with a short-pulse laser, and the extreme ultraviolet light that is generated in this case is used as a light source. This LPP light source is an influential candidate for EUV exposure light sources in which a power of several tens of watts or greater is required.

In FIG. 6, short-pulse driving laser light generated by a driving laser device 25 is gathered and directed onto a target 22 that is caused to jet from a nozzle 21 inside a vacuum chamber (not shown in the figures). As a result, the target 22 is converted into a plasma, and extreme ultraviolet light 13 with a wavelength of ten odd nanometers is generated as a result of this conversion into plasma. Extreme ultraviolet light 13 with a relatively high output can be obtained by gathering this light with a concave mirror 34 or the like.

An LPP light source has the excellent features described in 1.1 through 1.5 below. Specifically:

1.1 Since the plasma density can be set at a high value, an extremely high brightness that is close to black body radiation is obtained.

1.2 The emission of light having substantially only the required wavelength band can be accomplished by selection of the target 22.

1.3 The light source is a point light source that has a substantially isotropic angular distribution, and there are no structures such as electrodes or the like around the light source.

1.4 The generation of impurities can be kept to a minimum.

1.5 An extremely large capture steric angle of $2\pi$ sterad can be ensured.

Currently, TRW Co. in the USA is developing an LPP light source in which an LD-excited YAG laser device (wavelength 1 μm) of the 1.5 kW class is caused to irradiate the target 22. When the target 22 is a solid target, a relatively high efficiency of 1 to several percent can be obtained as the conversion efficiency from laser light to the extreme ultraviolet light 13.

However, when the target 22 is a solid, it is difficult to convert all of the target 22 into a plasma. The target 22 that is not converted into a plasma is melted by the plasma at a temperature of several ten thousand degrees, and is released in large quantities as particle masses (debris) with a diameter of several μm or greater. This debris adheres to the surface of the concave mirror 34 that gathers the extreme ultraviolet light 13, and causes damage to the multi-layer film or the like, so that the practical utility of the LPP is conspicuously reduced.

On the other hand, when an Xe gas jet which is considered to show less debris than a solid is used as the target 22, the conversion efficiency from laser power to extreme ultraviolet light 13 is reportedly about 0.5%. Assuming that half of the extreme ultraviolet light 13 that is generated can be captured, then a laser device that has an extremely high output of 20 kW is required in order to obtain 50 W of extreme ultraviolet light 13 in the case of a gas target 22.

The selection of the target 22 and the method of supplying this target at a high density to the plasma generating position inside the vacuum chamber are the keys to achieve an increase in the output of the extreme ultraviolet light source 11. In concrete terms, the conditions described in 2.1 through 2.6 below are necessary.

2.1 The light emission efficiency in the vicinity of the desired wavelength (13 to 14 nm) must be high.

2.2 It must be possible to handle laser irradiation with a high repetition frequency.

2.3 Long-term continuous laser irradiation must be possible.

2.4 The plasma generating position and amount of plasma generated in each laser irradiation must all be maintained within a required precision.

2.5 The structure used must be able to efficiently capture the generated extreme ultraviolet light 13.

2.6 There must be little generation of debris.

In the past, tin (solid), xenon (gas), lithium (solid) and the like have been tried as materials of the target 22 that are suitable for light emission in the vicinity of 13 to 14 nm where a high reflectivity is efficiently obtained in an Mo/Si multi-layer film.

In particular, Xe is an inert gas that is chemically stable, and is at the same time a gas at ordinary temperatures; accordingly, since this material shows little adhesion to the mirror and few chemical reactions, as well as little generation of debris, Xe has attracted attention as an effective target 22, and has been studied.

In the past, systems such as those described in 3.1 through 3.7 below have been proposed and tried as supply methods when Xe is used as the target.

3.1 A gas jet system in which a high pressure is applied to Xe gas, and the gas is caused to jet into a vacuum from a nozzle 21.

3.2 A cluster jet system in which very small solid particles are created by the cooling effect of adiabatic expansion.

3.3 A spray system in which a liquid is sprayed from a nozzle 21.

3.4 An Xe pellet system in which solid Xe ice is dropped.

3.5 An Xe droplet system in which liquid Xe is dropped.

3.6 A system in which a laser is caused to strike a solid Xe ice mass.

3.7 A liquid filament system in which liquid Xe is caused to fly in a straight jet from a fine tube, and this jet is irradiated with pulsed laser light.

In particular, the liquid filament system of 3.7 appears to be the most advantageous system among systems for generating extreme ultraviolet light with a wavelength of 13 nm by means of Xe that have been reported so far.

Specifically, the density of the target 22 is increased by cooling xenon to a temperature below the boiling point (approximately minus 160° C.) so that this xenon is liquefied. Furthermore, the target 22 is supplied at a high density to a considerably distance (up to about 50 mm) from the nozzle 21 by relaxing the diffusion from the nozzle 21, and a plasma is generated by irradiating the target with laser light in this position.

Here, the distance between the nozzle 21 and the plasma generation position (laser light irradiation position) is defined as the working distance.

This liquid filament system has the technical advantages described in 4.1 through 4.6 below.

4.1 Compared to a gas-form target, the density can be increased to a high density that is close to the density of solid; accordingly, a high conversion efficiency is ensured.

4.2 The plasma generation point can be set at a long distance of 10 mm or greater from the nozzle 21, so that damage to the nozzle 21 caused by the heat of the plasma, and the resulting generation of debris, can be reduced.

4.3 The plasma generation point can be set in the center of the vacuum chamber, so that a high EUV light gathering efficiency is obtained.

4.4 The size of the plasma is small, so that the required etendue can easily be obtained.

4.5 The operation is continuous, and emission is accomplished by applying pressure to the liquid Xe; accordingly, there is no need for a driving mechanism.

4.6 The jet that is not converted into a plasma is in solid form, and is cooled and solidified by adiabatic expansion as the target 22 advances, so that recovery is easy.

However, the problems described in 5.1 through 5.6 below are encountered in abovementioned liquid filament system.

5.1 Hydrodynamic instability such as hose instability and the like resulting from the continuous jetting of a liquid from a fine tube tends to occur, so that the position of the target 22 oscillates spatially, thus making laser irradiation difficult.

5.2 It is difficult to supply the target 22 stably to a position that is removed from the nozzle. Accordingly, it is difficult to supply a target 22 with a large diameter, so that at present, only supply as a fine jet with a diameter of approximately 20 μm can be realized.

5.3 The light emission efficiency of the extreme ultraviolet light 13 relative to the power of the driving laser device 25 is relatively high. However, in order to increase the output of the extreme ultraviolet light source 11 to a high output, it is necessary to increase the diameter of the jet flow while increasing the power of the driving laser device 25 and maintaining the liquid jet characteristics "as is". This is difficult as described in 5.2 above.

5.4 As was indicated in 5.2 above, the diameter of the jet is approximately 20 μm, and it is difficult to gather laser light with a high output in a stable manner in such a narrow region. For example, if the diameter can be increased to approximately 100 μm, the gathering of laser light is facilitated, so that the burden on the laser is reduced.

5.5 As a result of abovementioned 5.1, a mechanism for spatial stabilization of the jet is required.

5.6 As a result of the above conditions, a value of approximately 25 kHz is currently the limit for achieving an increase in the output by increasing the repetition frequency while maintaining stable conditions.

Furthermore, the stable conditions in abovementioned 5.6 are conditions which are such that the stability of the spatial position of the jet is maintained at approximately 1 μm, and the fluctuation of the density is kept to 1% or less. These conditions are necessary in order to achieve the value required as the stability of the EUV output.

Thus, in order to achieve an output that is sufficient for utilization in EUV exposure, it is desirable to use a system in which Xe in a liquid droplet state is produced, and this Xe is irradiated with laser light, as in the Xe droplet system in which liquid Xe is dropped in the form of droplets as indicated in abovementioned 3.5. If such a system is used, large liquid droplets of Xe are formed; accordingly, the output of the extreme ultraviolet light 13 that is generated can be increased.

However, in the case of the Xe droplet system, since the velocity of the Xe is slow, the distance between the plasma generation position and the nozzle 21 (abovementioned working distance) decreases as the repetition frequency is increased. As a result, the nozzle 21 may be damaged by the heat of the plasma.

In order to solve this problem, it is necessary to increase the working distance so that the plasma generation position is separated from the nozzle 21.

However, in the case of abovementioned droplet system, since the Xe does not have a sufficient velocity, the liquid droplets diffuse so that the density drops as the Xe becomes farther removed from the nozzle 21. As a result, the following problem arises: namely, extreme ultraviolet light 13 with a sufficient output cannot be obtained.

DISCLOSURE OF THE INVENTION

The present invention was devised in light of abovementioned problems; it is an object of the present invention to provide an extreme ultraviolet light source device which makes it possible to increase a working distance and obtain extreme ultraviolet light with a high output.

In order to achieve the abovementioned object, the present invention is an extreme ultraviolet light source device which generates a plasma by irradiating a target with laser light from a driving laser device, and which generates extreme ultraviolet (EUV) light having a wavelength of several nanometers to several tens of nanometers, characterized in that the light source device comprises a target supply device that has a charge applying unit that applies a charge to the target, and an acceleration unit that accelerates the charged target using an electromagnetic field.

As a result, since the target is accelerated after leaving the nozzle, the working distance can be increased. Furthermore, as a result of the use of an electric charge, non-contact acceleration is possible, and the acceleration rate can also be freely controlled.

Furthermore, in the present invention, the target supply device supplies the target as ionized molecules, atoms or masses comprising a plurality of atoms.

As a result, since the target is ionized, charging of the target is facilitated.

Furthermore, in the present invention, the target supply device supplies the target as ionized clusters.

As a result, since the target is ionized, charging of the target is facilitated.

Furthermore, the present invention uses xenon (Xe) or a rare gas element as the target.

Xe is an inert gas that is chemically stable, and is at the same time a gas at ordinary temperatures; accordingly, this material shows little adhesion to the mirror and few chemical reactions, as well as little generation of debris. Furthermore, since extreme ultraviolet light with a wavelength of 13 to 14 nm is emitted, a low-loss reflective optical element can be manufactured using an Mo/Si multi-layer film.

Furthermore, the present invention uses a metallic element as the target.

Since extreme ultraviolet light with a wavelength of 13 to 14 nm is emitted, a low-loss reflective optical element can be manufactured using an Mo/Si multi-layer film.

Furthermore, the present invention uses lithium (Li), tin (Sn) or tin oxide ($SnO_2$) as the target.

Since extreme ultraviolet light with a wavelength of 13 to 14 nm is emitted, a low-loss reflective optical element can be manufactured using an Mo/Si multi-layer film.

Furthermore, the present invention uses molecules of liquid or gas at ordinary temperatures as the target.

Since a target that consists of liquid or gas at ordinary temperatures is used, handling is easy, and there is little generation of debris such as that seen in a solid.

Furthermore, the present invention uses water ($H_2O$) as the target.

Water is abundant in nature, and is therefore inexpensive.

Furthermore, the present invention uses a laser device with a MOPA (Master Oscillator Power Amplifier) system as the driving laser device.

As a result, the output of the driving laser device can easily be increased.

Furthermore, the present invention uses a pulsed YAG laser device with a wavelength in the vicinity of 1 μm as the driving laser device.

YAG laser devices with a high output are commercially marketed, and are easy to handle.

Furthermore, the present invention uses a YAG laser device, which is excited by a laser diode and is converted to a single mode using an adaptive optical element, as an oscillation stage laser, and a high-output YAG laser device as an amplification stage laser, as the driving laser device.

Since the wavelength is precisely controlled by the oscillation stage laser, and the light is amplified, high-output laser light with a stable wavelength can be obtained.

Furthermore, the present invention uses a pulsed carbon dioxide gas laser device which generates laser light with a wavelength in the vicinity of 10 μm as the driving laser device.

As a result of the use of carbon dioxide gas laser light with a long wavelength, interaction with a plasma having a small density is possible, so that even if the target is a gas-form target with a small density, the generation of a plasma can be accomplished efficiently.

Furthermore, the present invention uses a pulsed carbon dioxide gas laser device as the oscillation stage laser, and a CW carbon dioxide gas laser device as the amplification stage laser, as the driving laser device.

Since the wavelength is precisely controlled by the oscillation stage laser, and the light is amplified, high-output laser light with a stable wavelength can be obtained. Furthermore, since a CW carbon dioxide gas laser device is used as the amplification stage laser, the repetition frequency is determined by the oscillation stage laser, so that the frequency can easily be increased.

Furthermore, the present invention uses a pulsed carbon dioxide gas laser device as the oscillation stage laser, and a TEA carbon dioxide gas laser device as the amplification stage laser, as the driving laser device.

Since the wavelength is precisely controlled by the oscillation stage laser, and the light is amplified, high-output laser light with a stable wavelength can be obtained.

As a result of the use of a TEA carbon dioxide gas laser device as the amplification stage laser, a high output can easily be obtained.

Furthermore, in the present invention, Vt>Vp where Vt is an initial velocity of the accelerated target, and Vp is a mean plasma diffusion velocity of the plasma that is generated.

As a result, the target is quickly removed from the extreme ultraviolet light generating environment, and the repetition frequency can be increased to several MHz.

Furthermore, the present invention is devised so that a relationship of TL×Vt<Dp is established where TL is a time width of the pulsed laser generated by the driving laser device, Vt is an initial velocity of the target accelerated by the acceleration unit, and Dp is a maximum diameter of the light source plasma as determined from etendue constraints.

Furthermore, the present invention is devised so that a relationship of Dr>Vp×(Dc/Vt) is established where Dc is a distance between a plasma light emission point and a target recovery vessel that recovers the target, Dr is an effective radius of the recovery vessel part, Vt is an initial velocity of the accelerated target, and Vp is a means plasma diffusion velocity.

BRIEF DESCRIPTION OF THE DRAWINGS

FIG. 6 is a schematic diagram of an LPP light source.

BEST MODE FOR CARRYING OUT THE INVENTION

Preferred embodiments of the present invention will be described in detail below with reference to the attached figures.

Figure 1:
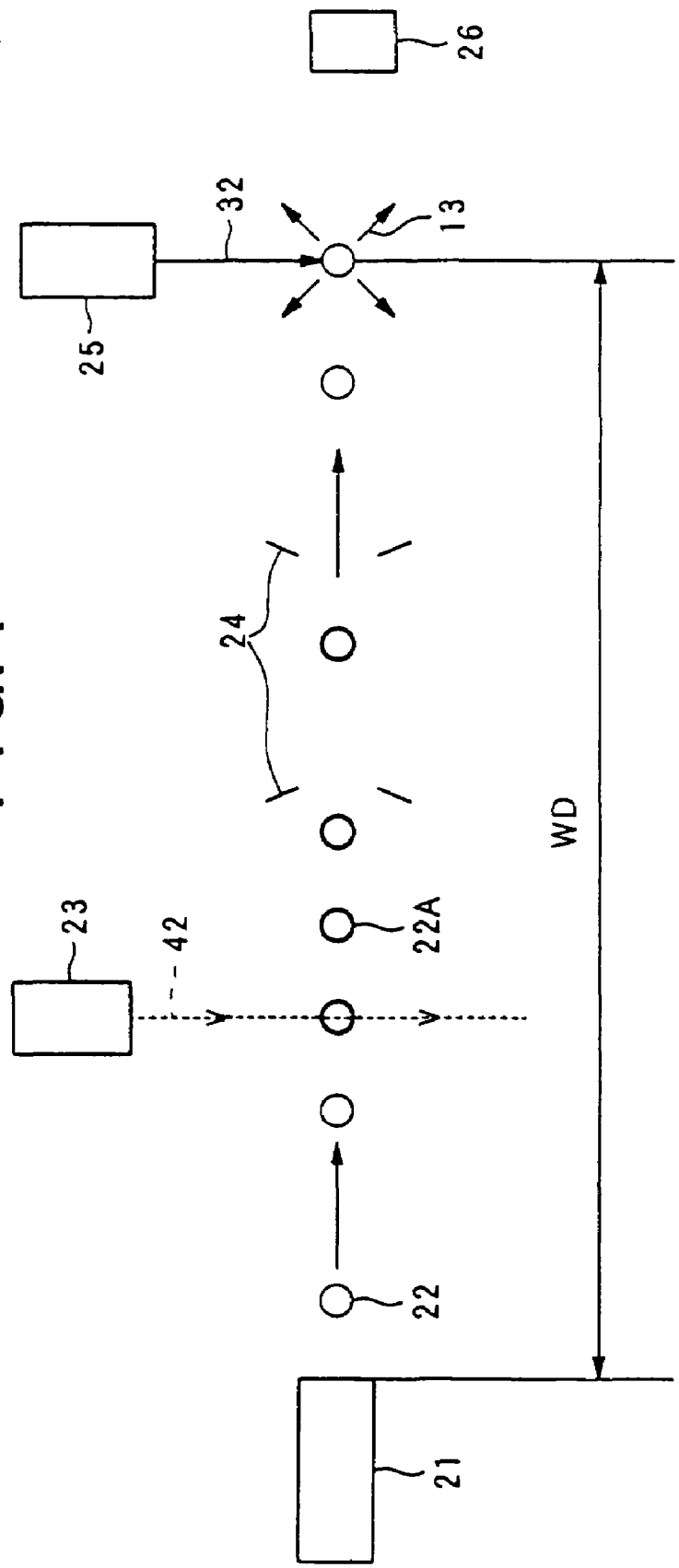
FIG. 1 is a structural diagram of an extreme ultraviolet light source device of a first embodiment.

FIG. 1 shows a structural diagram of an extreme ultraviolet light source device 11 of a first embodiment.

For example, a piezoelectric element or the like (not shown in the figures) is disposed inside a nozzle 21 that supplies the target 22, so that the target 22 can be caused to jet at a high velocity. The target 22, which is liquefied by cooling means (not shown in the figures), is emitted from the nozzle 21, and is charged by irradiation with an electron beam 42 generated by an electron beam generator 23 while the target is traveling at the emission velocity. The material of the target 22 is liquid Xe, solid Xe, or some other liquid or solid substance. If an electron beam 42 with a diameter of approximately 100 μm is used on a target 22 with a diameter of approximately 10 μm, the entire target 22 can be irradiated by the electron beam 42.

The traveling velocity of the charged target 22A is accelerated by (for example) a van de Graaff type accelerating device 24, and is subsequently converted into a plasma by irradiation with exciting laser light 32 emitted from a driving laser device 25, so that extreme ultraviolet light 13 is generated. Since main object of the extreme ultraviolet light source device shown in FIG. 1 is to accelerate the target 22, it is unimportant in this respect whether or not the target 22 that has passed through the accelerating device 24 is charged.

A target recovery vessel 26 that recovers the plasma and residual gas is disposed on the downstream side of the plasma generation point. It is important that the accelerated target 22 reach the laser light irradiation position while maintained a state of high density. The residue of the target that is not converted into a plasma, and the debris that is generated, are diffused and recovered at a high recovery rate before these substances adhere to the optical system.

In FIG. 1, the working distance is indicated by WD.

Furthermore, the means that apply a charge to the target 22 are not limited to the electron beam 42. For example, it would also be possible to charge the emitted target 22 by applying a high voltage to the nozzle 21. Furthermore, it would also be possible to ionize only the surface portions by irradiating the target 22 with laser light having an energy level that is weak enough that the target 22 is not vaporized.

Figure 2:
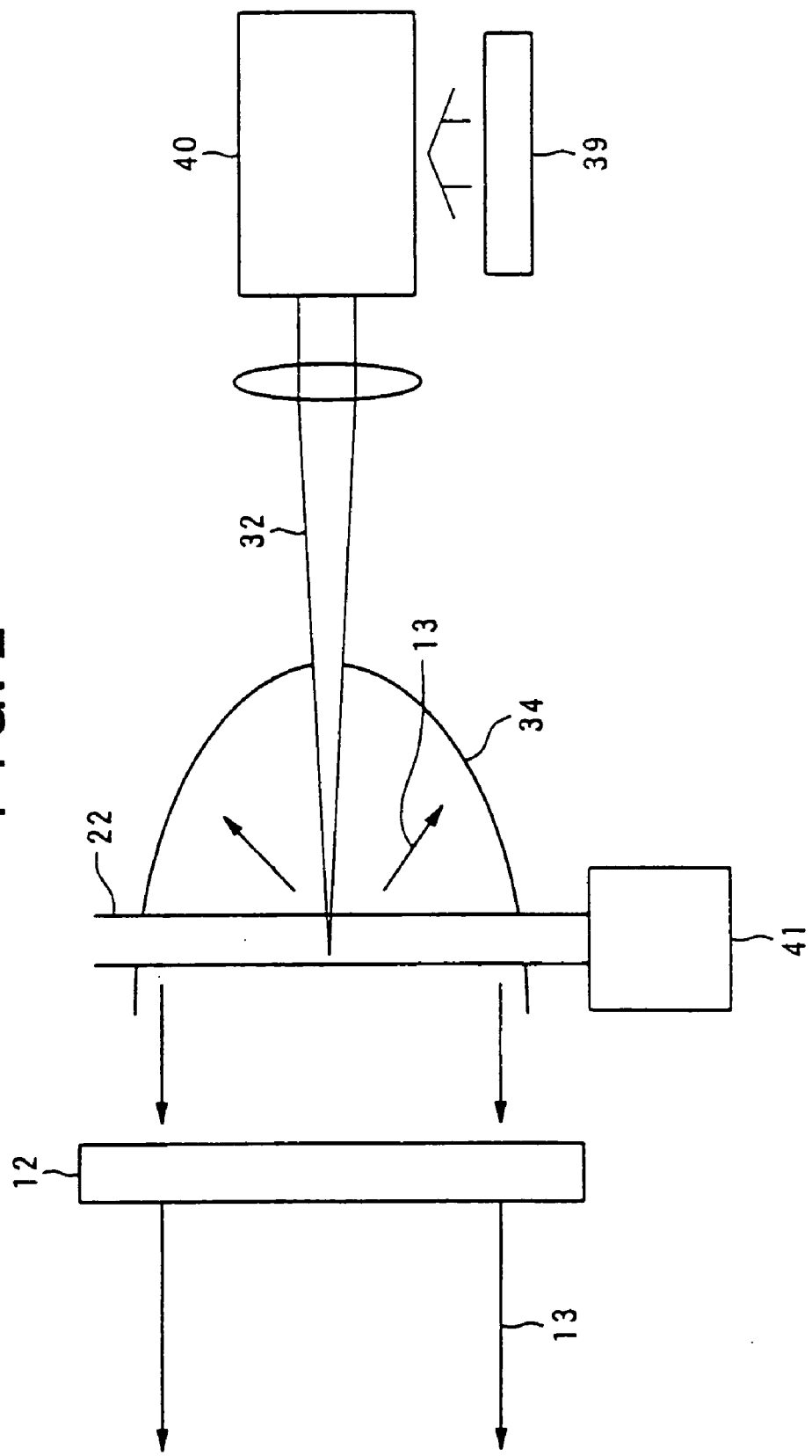
FIG. 2 is an explanatory diagram which shows an example of the construction of the extreme ultraviolet light source device.

An example of the construction of the extreme ultraviolet light source 11 is shown in FIG. 2. In this example, the target accelerating device 24 shown in FIG. 1 is used.

In the construction shown in FIG. 2, a YAG laser device 40 is used as the driving laser device. Specifically, this YAG laser device 40 is excited by an LD (laser diode), and exciting laser light 32 with a wavelength in the 1 μm band is focused using an irradiation optical system on the flow path of the target 22 separated from an ion cluster target supply device 41 (described later) by several centimeters, so that a plasma is generated.

The plasma thus generated has a diameter of several tens of microns to 1 mm. The extreme ultraviolet light 13 that is generated from this plasma is focused by means of a focusing optical system such as a concave mirror 34 or the like whose optical axis is caused to coincide substantially with the optical axis of the light, and is here transmitted to an illumination optical system (not shown in the figures). In this case, the light is caused to pass through a debris shield 12 which is used to remove debris, so that only the extreme ultraviolet light 13 is emitted into the illumination optical system 14.

Thus, since the target 22 is accelerated and caused to move at a high velocity by the accelerating device 24, a large distance from the nozzle 21 is obtained, so that the nozzle 21 can be removed to a distance from the plasma. Accordingly, heating damage to the nozzle 21 caused by the plasma can be relatively reduced.

Furthermore, since the working distance can be increased, installation of the focusing optical system used to extract the extreme ultraviolet light 13 is facilitated. In the present invention, a rotationally symmetrical parabolic or spherical mirror is used in the focusing optical system, and the driving laser light is YAG laser light that is focused so that the optical axis of this light is caused to coincide substantially with the optical axis of the parabolic or spherical mirror.

As was described above, the efficiency that can be utilized in exposure drops unless the size of the extreme ultraviolet light source 11 is small enough to fit the constraints of the etendue. In other words, the focused diameter of the laser light must be small enough to allow utilization as a light source.

Figure 3:
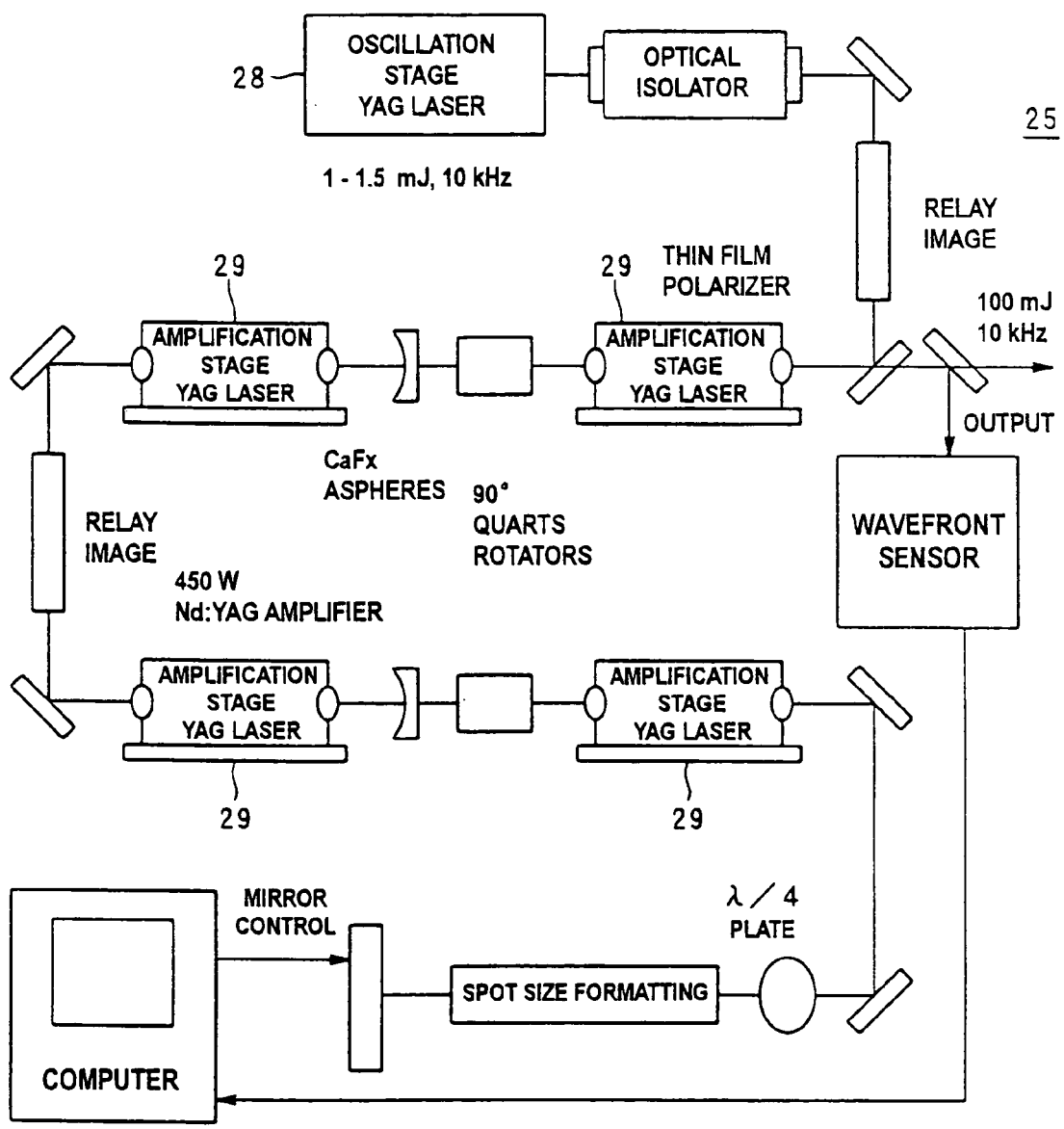
FIG. 3 is a structural diagram of the YAG laser device used in the present invention.

Another example of the construction of the driving laser device 25 used in the present invention is shown in FIG. 3

In this embodiment, the driving laser device 25 is constructed using an oscillation stage YAG laser 28 consisting of a single-mode YAG laser, and an amplification stage YAG laser 29 consisting of a plurality of high-output YAG lasers.

In the figure, the oscillation stage laser 28 is a pulsed YAG laser that can be operated at a high repetition frequency, and is designed so that a horizontal mode comprising a single mode or lower-order mode that is close to a single mode can be output. Since this oscillation stage laser requires only a small output, the repetition frequency can be increased to approximately 10 kHz, and stabilization of the beam mode is relatively easy. The pulsed light of this oscillation stage laser is amplified by a plurality of high-output YAG lasers connected in series in the after-stage, so that pulsed laser light with a large output power is obtained.

If an attempt is made to realize an EUV output at the 100 W level using a kHz repetition frequency, it may be predicted that the input energy per pulse will be large, and that problems in terms of the generation of high-velocity particles from the plasma, stability of the individual pulses and the like will occur.

Accordingly, a rapid repetition frequency is desirable; fortunately, in the case of solid lasers such as Nd:YAG lasers and the like, the extraction efficiency is constant at repetition frequencies of 10 kHz or greater. When a nozzle 21 or the like is used, it is necessary to wait for the generation of the subsequent plasma until the preceding gas is sufficiently rarefied by diffusion. Furthermore, this gas has minus effects such as debris and re-absorption of the extreme ultraviolet light. Accordingly, by causing the target 22 to move at an initial velocity Vt that is equal to or greater than the diffusion velocity Vp, it is possible to achieve quick removal of the target from the extreme ultraviolet light generating environment, and to increase the repetition frequency to several MHz.

One example of design is shown below.

| | |
|---|---|
| Mean EUV output (13.4 nm, 2.5% bw, 2πSr) | 100 W |
| Repetition frequency | 1 MHz |
| Pulse width | 5 ns |
| Pulse energy | 100 µJ |
| Efficiency | 1% |
| Required laser specifications: | |
| Pulse energy | 10 mJ |
| Pulse width | 2 ns |
| Repetition frequency | 10 kHz– 1 MHz |
| Mean output | 10 kW |
| High-velocity target 22 specifications: | |
| Velocity | 100 km/s– 1000 km/s |
| Size | ϕ100 µm |
| (Movement distance between laser pulses | 0.2 mm) |

Furthermore, the target 22 can also be pulsed by applying a modulation to the acceleration voltage of the ion beam controlling power supply (not shown in the figures) in the accelerating device 24. As a result of such pulsing, not only can the utilization efficiency of the Xe be increased, but the coupling of the target 22 between pulses can be weakened, so that the stability of the pulse energy can also be increased.

Furthermore, the target 22 can be recovered at a high recovery rate by disposing a target recovery vessel 26 that recovers the plasma and residual gas on the downstream side of the plasma generation point, and by setting so that diameter>{plasma diffusion velocity×(target 22→recovery vessel) elapsed movement time} is satisfied.

Next, a second embodiment will be described.

In the second embodiment, a carbon dioxide gas laser device with a 10 µm wavelength band is used as the driving laser device 25. The laser light is focused by an irradiation optical system on the flow path of a gas-form target 22 that is separated from the nozzle 21 by a distance of several centimeters to several tens of centimeters, so that a plasma is generated.

The plasma that is thus generated has a length of several millimeters to several centimeters. The optical axis of the focusing optical system is caused to coincide substantially with the long axis of the plasma generated on this filament, and the EUV light generated from the plasma is focused so that this EUV light is focused and transmitted to the illumination optical system 14. In this case, the light passes through the debris shield 12 so that debris is removed, and so that only the extreme ultraviolet light 13 is emitted into the illumination optical system 14.

In the second embodiment, since carbon dioxide gas laser light with a long wavelength is used, interaction is possible even in the case of a plasma with a small density, so that plasma generation can be accomplished efficiently even if the target 22 is a gas-form target with a low density.

Accordingly, even if the laser light irradiation position is distant from the nozzle 21 so that the target 22 becomes rarefied, plasma generation can be performed efficiently, so that the working distance can be increased. Accordingly, heating damage to the nozzle 21 caused by the plasma can be relatively reduced.

Furthermore, since the working distance can be increased, the installation of the focusing optical system used to focus the extreme ultraviolet light 13 is easy. In the present invention, focusing is accomplished using a rotationally symmetrical parabolic or spherical mirror in the focusing optical system, and the driving laser focuses $CO_2$ laser light from an optical axis that substantially coincides with the optical axis of the optical system.

As was described above, the efficiency that can be utilized in exposure drops unless the size of the extreme ultraviolet light source 11 is small enough to fit the constraints of the etendue. In other words, the focused diameter of the laser light must be small enough to allow utilization as a light source.

Figure 4:
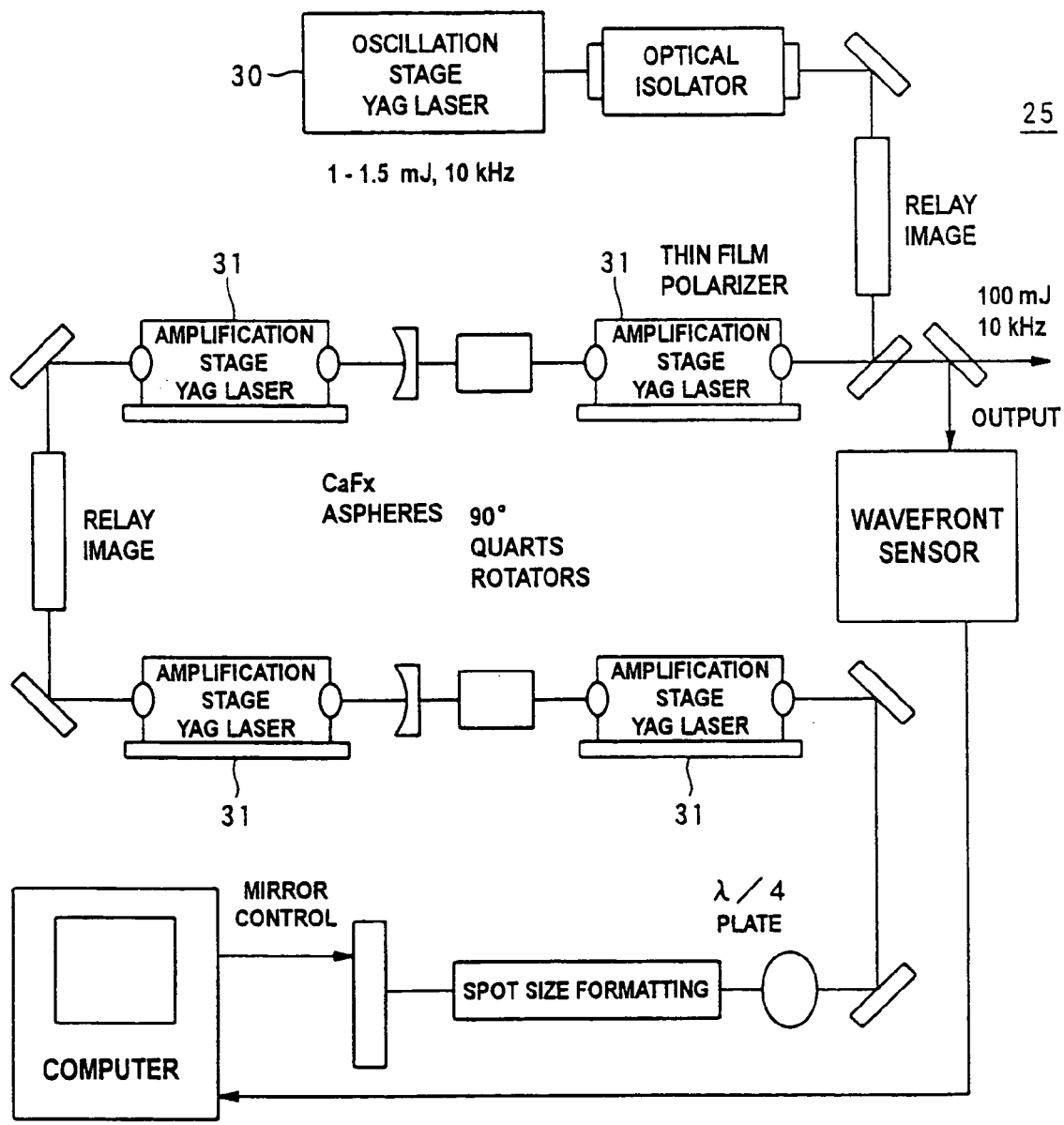
FIG. 4 is a structural diagram of the $CO_2$ laser light source used in the present embodiment.
Figure 5:
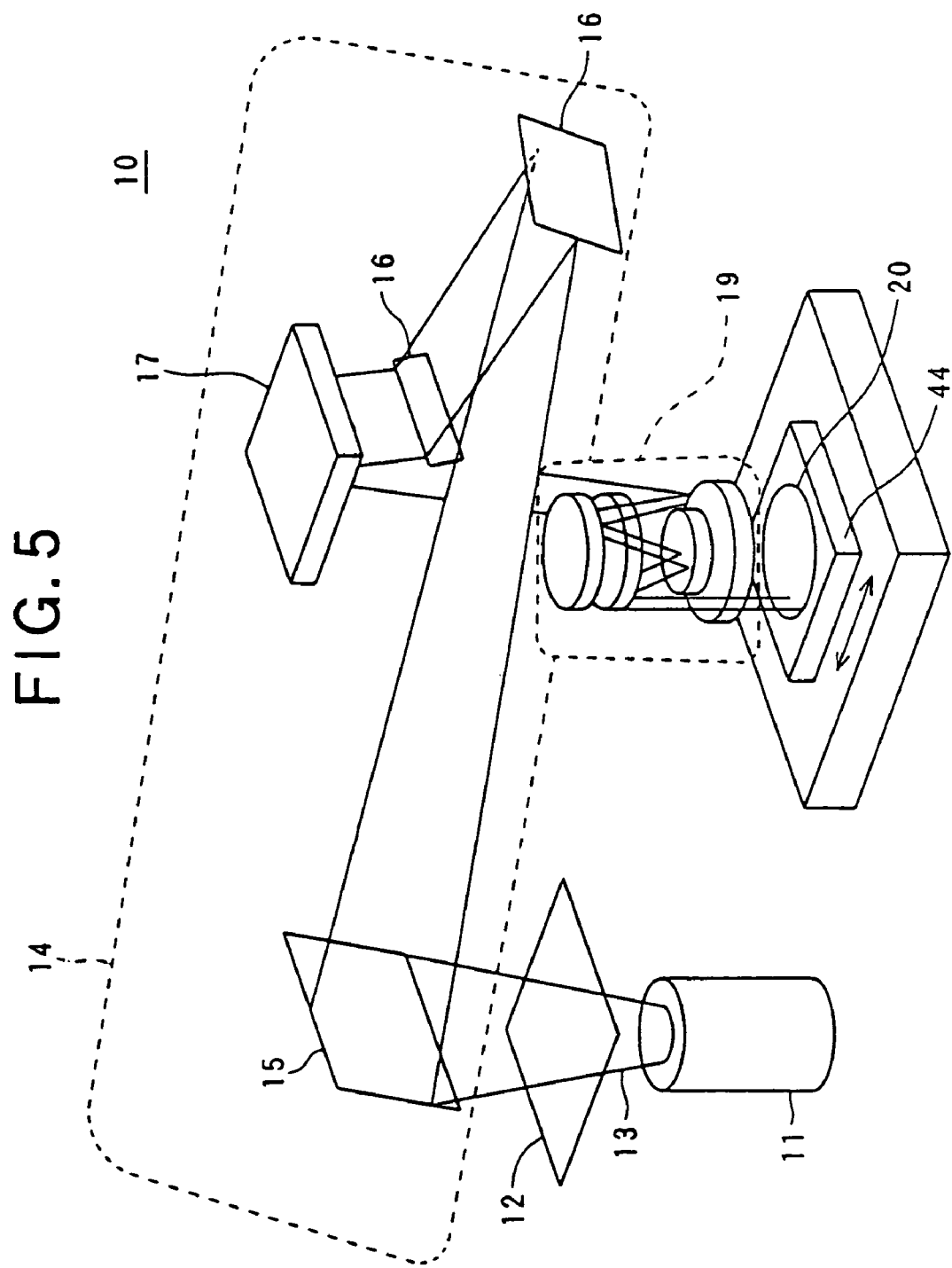
FIG. 5 is an explanatory diagram which shows one example of an EUV exposure apparatus.

The construction of the $CO_2$ laser light source used in the present invention is shown in FIG. 4.

In this embodiment, the driving laser device 25 is constructed using an oscillation stage laser 30 consisting of a single-mode $CO_2$ laser, and using a plurality of high-output $CO_2$ lasers 31 as the amplification stage laser.

The oscillation stage laser 30 shown in the figure is a pulsed oscillation single-mode $CO_2$ laser that is capable of operation at a high repetition frequency, and is designed so that a horizontal mode comprising a single mode or lower-order mode that is close to a single mode can be output. Since this oscillation stage laser requires only a small output, the repetition frequency can be increased to approximately 10 kHz, and stabilization of the beam mode is relatively easy.

The pulsed light of this oscillation stage laser 30 is amplified by a plurality of CW-$CO_2$ laser devices 31 connected in series in the after-stage, so that pulsed light with a large output power is obtained. In this case, since the amplification medium is continuously present (CW), the repetition frequency is determined by the performance of the oscillation stage laser. Accordingly, the repetition frequency can easily be increased compared to the case of the TEA-$CO_2$ laser device described later.

In this case, wasted energy can be saved by synchronizing the oscillation stage laser 30 and amplification stage lasers 31 and applying a modulation, so that the system efficiency can be improved.

Embodiment 3 has a construction that is substantially similar to that described above; in this embodiment, the amplification stage lasers are constructed from TEA-$CO_2$ lasers. In this case, the following merit is obtained: namely, the pulse energy can be increased to a greater value than in a case where abovementioned amplification stage lasers are constructed from CW-$CO_2$ lasers.

In the present invention, as was described above, the target 22 can be controlled by applying a charge to clusters, or applying an electromagnetic field to a charged target 22 formed by ionizing gas molecules. Accordingly, the following effects are obtained:

6.1 A high-velocity flow of the target 22 can be generated by combining the present invention with a technique using an ion beam accelerating device 24.

6.2 The plasma generation point can be removed to a position that is distant from the nozzle 21. As a result, there is little damage to the nozzle 21, and design of the focusing optical system is easy.

6.3 Since the Xe is charged, the Xe that is not used can be electromagnetically transported to the recovery nozzle 21.

6.4 The clusters can be actively constrained and diffusion-controlled to 1 mm or less, so that a stable etendue can be realized.

6.5 By increasing the velocity, it is possible to increase the repetition frequency to 100 kHz or greater.

The invention claimed is:

1. An extreme ultraviolet light source device which generates a plasma by irradiating a target (22) with laser light from a driving laser device (25), and which generates extreme ultraviolet (EUV) light having a wavelength of several nanometers to several tens of nanometers, said light source device comprising a target supply device that has charge applying means (23) that applies a charge to the target (22), and acceleration means (24) that accelerates the charged target using an electromagnetic field toward a plasma generation position where laser light and the target collide.

2. The extreme ultraviolet light source device according to claim 1, characterized in that said target supply device supplies the target (22) as ionized molecules, atoms or masses comprising a plurality of atoms.

3. The extreme ultraviolet light source device according to claim 2, characterized in that said target supply device supplies the target (22) as ionized clusters.

4. The extreme ultraviolet light source device according to claim 1, characterized in that xenon (Xe) or a rare gas element is used as said target (22).

5. The extreme ultraviolet light source device according to claim 1, characterized in that a metallic element is used as said target (22).

6. The extreme ultraviolet light source device according to claim 5, characterized in that lithium (Li), tin (Sn) or tin oxide ($SnO_2$) is used as said target (22).

7. The extreme ultraviolet light source device according to claim 1, characterized in that molecules of liquid or gas at ordinary temperatures are used as said target (22).

8. The extreme ultraviolet light source device according to claim 7, characterized in that water ($H_2O$) is used as said target (22).

9. The extreme ultraviolet light source device according to claim 1, characterized in that a MOPA (Master Oscillator Power Amplifier) system is used as said driving laser device (25).

10. The extreme ultraviolet light source device according to claim 1, characterized in that a pulsed YAG laser device with a wavelength in the vicinity of 1 μm is used as said driving laser device (25).

11. The extreme ultraviolet light source device according to claim 10, characterized in that a YAG laser device (28), which is excited by a laser diode and is converted to a single mode using an adaptive optical element, is used as an oscillation stage laser, and a high-output YAG laser device (29) is used as an amplification stage laser, as said driving laser device (25).

12. The extreme ultraviolet light source device according to claim 1, characterized in that a pulsed carbon dioxide gas laser device which generates laser light with a wavelength in the vicinity of 10 μm is used as said driving laser device (25).

13. The extreme ultraviolet light source device according to claim 12, characterized in that a pulsed carbon dioxide gas laser device (30) is used as the oscillation stage laser, and a CW carbon dioxide gas laser device (31) is used as the amplification stage laser, as said driving laser device (25).

14. The extreme ultraviolet light source device according to claim 13, characterized in that the pulsed carbon dioxide gas laser device is used as the oscillation stage laser, and a TEA carbon dioxide gas laser device is used as the amplification stage laser, as said driving laser device (25).

15. The extreme ultraviolet light source device according to claim 1, characterized in that Vt>Vp where Vt is an initial velocity of said accelerated target (22), and Vp is a mean plasma diffusion velocity of the plasma that is generated.

16. The extreme ultraviolet light source device according to claim 1, characterized in that a relationship of TL×Vt<Dp is established where TL is a time width of the pulsed laser oscillated from the driving laser device (25), Vt is an initial velocity of the target (22) accelerated by the acceleration means, and Dp is a maximum diameter of the light source plasma as determined from etendue constraints.

17. The extreme ultraviolet light source device according to claim 1, characterized in that a relationship of Dr>Vp×(Dc/Vt) is established where Dc is a distance between a plasma light emission point and a target recovery vessel (25) that recovers the target (22), Dr is an effective radius of the recovery vessel part, Vt is an initial velocity of the accelerated target (22), and VP is a means plasma diffusion velocity.

* * * * *